Dec. 31, 1963 J. BAUDE 3,116,465

TRIGGERED BLOCKING OSCILLATOR WITH SURGE PREVENTION

Filed Aug. 31, 1960

Inventor
John Baude
By Warren F.B. Lindsley
Attorney

United States Patent Office 3,116,465

Patented Dec. 31, 1963

3,116,465
TRIGGERED BLOCKING OSCILLATOR WITH SURGE PREVENTION

John Baude, Milwaukee, Wis., assignor to Allis-Chalmers Manufacturing Company, Milwaukee, Wis.

Filed Aug. 31, 1960, Ser. No. 53,079
4 Claims. (Cl. 331—112)

This invention relates to semiconductor oscillators and more particularly to a single transistor magnetic coupled oscillator switch.

Heretofore transistor oscillator circuits have been used for creating pulses from a direct current source, however, these circuits have been designed for use as a power source of continuous oscillations. Oscillation occurred the moment power is supplied thereto. No provision heretofore has been employed for starting and stopping the oscillator the moment it receives an external signal.

In accordance with the invention claimed a new and improved semiconductor switch has been provided for use as an on-off switch. This switch which, for example, may be called a transistor oscillator switch is usable for interconnecting a source of electrical energy with a load circuit and comprises a transistor having a pair of load circuit controlling electrodes and a control electrode. A transformer is provided for interconnecting one of the load electrodes with one of the others of said electrodes to provide positive feed back. Means are connected across the source and the load electrodes to prevent instantaneous current surges upon application of control power, and means are provided for interconnecting the control electrode and one of the load electrodes for biasing the transistor to cut off. Upon the application of a triggering signal to the control electrode the transistor is rendered momentarily conductive, and alternately passes and blocks current flow in a sustained oscillation mode of operation through the transformer depending on its saturation.

It is, therefore, one object of this invention to provide a new and improved oscillator switch.

Another object of this invention is to provide a new and improved oscillator switch employing a single semiconductor device.

A further object of this invention is to provide a new and improved oscillator switch employing a transistor which is biased to cut off and rendered conductive by a triggering signal.

A still further object of this invention is to provide a new and improved oscillating transistor switch biased to cut off which is momentarily rendered conductive so as to alternately pass and block current flow therethrough in a sustained manner of operation.

Figure 1:
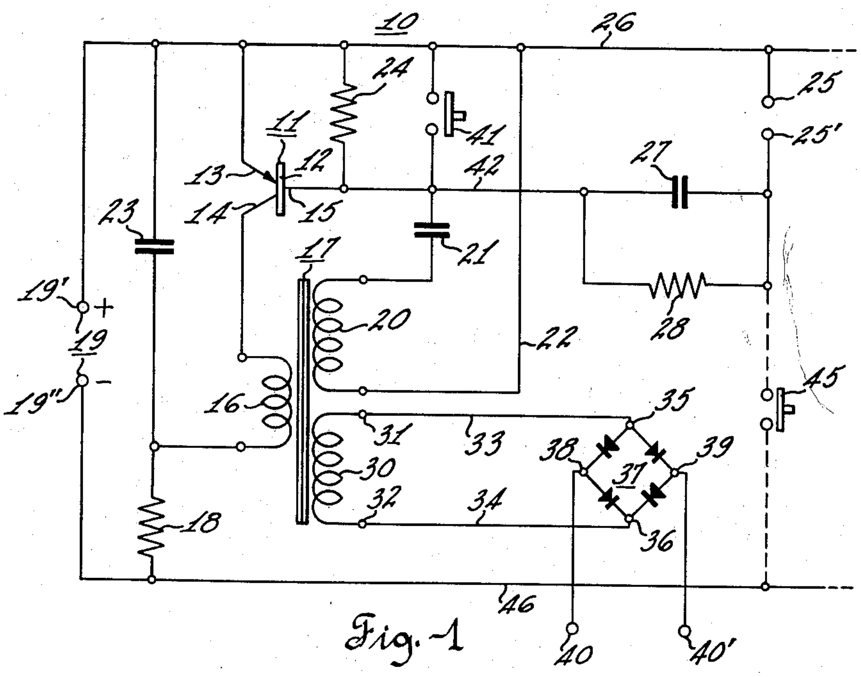
Figure 2:
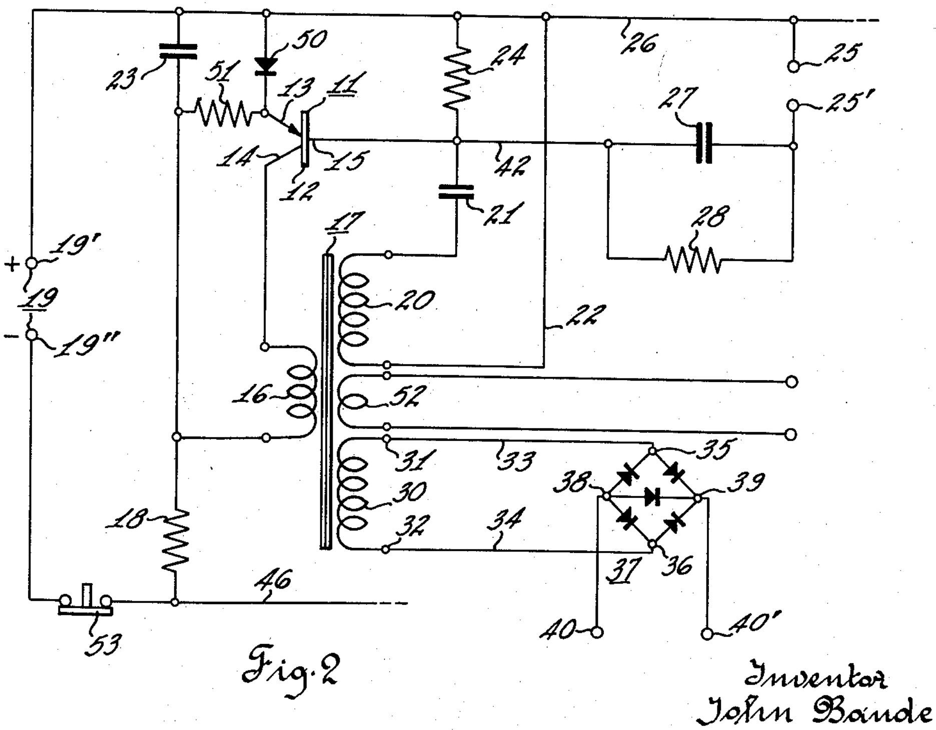

Objects and advantages other than those set forth will be apparent from the following description when read in connection with the accompanying drawing, in which:

FIG. 1 is a schematic circuit diagram of a transistor magnetic coupled oscillator switch and embodying the invention; and FIG. 2 is a schematic circuit diagram of a modification of the oscillator switch shown in FIG. 1.

Referring more particularly to the drawing by characters of reference, FIG. 1 discloses a single transistor magnetic coupled oscillator switch 10 which is suitable for use as a reliable static switch especially under conditions where electrical isolation of the load circuits from the control circuit is essential. In FIG. 1, transistor 11 comprises a semiconductive body 12 having a load or emitter electrode 13, a load or collector electrode 14 and a control or base electrode 15. The emitter and collector electrodes 13 and 14 are connected in series with the low potential winding 16 of an impedance changing transformer 17 and a resistor 18 across a source of direct current potential 19 having terminals 19′, 19″. A high potential winding 20 of transformer 17 has one end connected to the base electrode 15 through a capacitor 21 and the other end connected through a conductor 22 to terminal 19′ of source 19. A capacitor 23 is connected in shunting arrangement with emitter and collector electrodes 13 and 14 and in series with resistor 18 across the source 19. The emitter electrode 13 is biased with respect to the base electrode 15 by a resistor 24 which, for example, may be of from 30 to 50 ohms. This resistor is connected directly across the emitter and base electrodes and provides "off" stability without the use of a reverse bias voltage usually provided in the prior art by a separate battery. The circuit comprising the series connection of resistor 18 and capacitor 23 across the control source 19 is a timing circuit for providing a certain time delay for applying the full value of the control voltage of source 19 to the oscillator switch 10, thereby preventing the inductive effect of the leakage current flowing through winding 16 from triggering off the oscillator switch prematurely.

An external triggering signal may be applied to terminals 25, 25′ which signal is transmitted to the emitter electrode 12 through a conductor 26 and to the base electrode 15 through a parallel arrangement of capacitor 27 and resistor 28. Another winding 30 of transformer 17 has its terminals 31 and 32 connected through conductors 33, 34, respectively, to input terminals 35, 36 of a rectifier 37. Load terminals 38, 39 of rectifier 37 are connected to terminals 40, 40′, respectively, of a load circuit.

The operation of the circuit illustrated in FIG. 1 is as follows: with control voltage applied between terminals 19′ and 19″ the oscillator switch is in the "off" position and terminals 40, 40′ are deenergized. Applying an external triggering signal to terminals 25, 25′ makes the base electrode 15 of transistor 11 momentarily negative with respect to its emitter electrode and current now passes from terminal 19′ through the emitter electrode 13, collector electrode 14, winding 16, of transformer 17, resistor 18 to terminal 19″. This current flow induces in winding 20 of transformer 17 a current of such polarity that transistor 11 is kept conductive until the core of transformer 17 reaches a state of saturation at which time transistor 11 ceases to conduct current through the emitter collector circuit and the magnetic energy stored in the core of transformer 17 is used to induce a current of opposite polarity in winding 30 of transformer 17. The current flowing in winding 30 is essentially an alternating current of a looped configuration other than square current wave form. The looped configuration described occurs because of the smoothing effect of the low resistance of resistor 24 in combination with capacitor 21 and the reactance of winding 20. The oscillator after a single triggering pulse runs indefinitely until the oscillations of the transistor oscillator are stopped by pushing switch button 41 connected between conductors 26 and 42. Conductors 26 and 42 are connected, respectively, to the emitter electrode 13 and base electrode 15 of transistor 11 as shown in FIG. 1. A switch 45 may be connected between terminal 25′ and a conductor 46 connected to terminal 19″ of source 19. This switch also may be used for stopping the oscillator from oscillating.

It is important to note that the relatively large number of turns on winding 20 as compared with the relatively small number of turns on winding 16 of transformer 17 improves operational stability of the oscillator for on-off switching purposes. This ratio of turns of the windings in question is generally contrary to the arrangements found in the prior art. Another feature of the disclosed invention is the fact that the load circuit connected to terminals 40, 40′ is not directly connected to the control power source 19', 19''. The full wave rectifier 37 provides an effective isolation for surges which may enter the oscillator from the load winding 30 and trigger the oscillator prematurely.

In accordance with the invention claimed capacitor 23 and resistor 18 provide a time delay for triggering into conduction transistor 11 by applying thereto full operational voltage from the control source 19', 19''. Further, the very low resistance of resistor 24 tying the base electrode 15 to emitter electrode 13 as well as the relative large number of turns of winding 16 provides an oscillator capable of effectively operating as an on-off switch.

In the circuit disclosed and claimed no external signal except the one designated for that purpose will start oscillation, otherwise the switch would function prematurely or would function at a time when not wanted. By the introduction of resistor 24 between the base electrode 15 and the emitter electrode 13, which is connected to the positive terminal 19' of source 19, the oscillator switch is rendered stable in its off or nonconductive condition.

FIG. 2 illustrates a modification of the structure shown in FIG. 1 wherein similar parts are identified by identical reference characters. In order to further increase the cut off potential of the transistor switch disclosed a diode 50 is connected between the emitter electrode 13 and conductor 26, and a resistor 51 is connected between the emitter electrode 13 and between capacitor 23 and resistor 18 in their series connection across terminals 19', 19'' of source 19. Transformer 17 is provided with a further winding 52 for controlling the oscillator switch. A switch 53 may be used for controlling the connection of source 19 to the oscillator switch.

Although but a few embodiments of the present invention have been illustrated and described it will be apparent to those skilled in the art that various changes and modifications may be made therein without departing from the spirit of the invention or from the scope of the appended claims.

Having now particularly described and ascertained the nature of my said invention and the manner in which it is to be performed, I declare that what I claim is:

1. A blocking oscillator circuit for producing a series of oscillations which are started by a predetermined signal pulse, said circuit comprising a semiconductor having a pair of load circuit controlling electrodes and a control electrode, a source of potential, inductive means coupling said source between said load electrodes, said inductive means comprising a first coil connected between one of said load electrodes and said source and a second coil inductively coupled to said first coil and connected to said control electrode to feed back to said control electrode a portion of the voltage developed across said first coil, means connecting said control electrode to one of said load electrodes for biasing said semiconductor to cut off, means connected across said source and said load electrodes for preventing instantaneous current surges upon application of electric power to said source, and means for applying a triggering signal pulse to said control electrode for momentarily rendering said semiconductor conductive, said semiconductor alternately passing and blocking current flow through said inductive device depending on its saturation.

2. A blocking oscillator circuit for producing a series of oscillations which are started by a predetermined signal pulse, said circuit comprising a semiconductor having a pair of load circuit controlling electrodes and a control electrode, a source of potential, inductive means coupling said source between said load electrodes, said inductive means comprising a first coil connected between one of said load electrodes and said source and a second coil inductively coupled to said first coil and connected to said control electrode to feed back to said control electrode a portion of the voltage developed across said coil, means connecting said control electrode to one of said load electrodes for biasing said semiconductor to cut off, a timing circuit connected across said source and said load electrodes to prevent instantaneous current surges upon application of electric power to said source, and means for applying a triggering signal pulse to said control electrode for momentarily rendering said semiconductor conductive, said semiconductor alternately passing and blocking current flow through said inductive device depending on its saturation.

3. A blocking oscillator circuit for producing a series of oscillations which are started by a predetermined signal pulse, said circuit comprising a transistor having a pair of load circuit controlling electrodes and a control electrode, a source of potential, a transformer coupling said source between said load electrodes, said transformer comprising a first coil connected between one of said load electrodes and said source and a second coil inductively coupled to said first coil and connected to said control electrode to feed back to said control electrode a portion of the voltage developed across said first coil; means connecting said control electrode to one of said load electrodes for biasing said transistor to cut off, a timing circuit comprising a capacitor and a resistor connected in series across said source and said load electrodes for preventing instantaneous current surges upon application of electric power to said source, means for applying a triggering signal pulse to said control electrode for momentarily rendering said transistor conductive, said transistor alternately passing and blocking current flow through said inductive device depending on its saturation, and means for interrupting the current flow through said transistor to render said switch nonconductive.

4. A blocking oscillator circuit for producing a series of oscillations which are started by a predetermined signal pulse, said circuit comprising a transistor having an emitter electrode, a collector electrode and a base electrode, a source of potential, transformer means coupling said source between said emitter electrode and said collector electrode, said transformer means comprising a first coil connected between one of said emitter electrode and said collector electrode and said source and a second coil inductively coupled to said first coil and connected to said base electrode to feed back to said base electrode a portion of the voltage developed across said first coil, resistance means connecting said base electrode to one of said emitter electrode and said collector electrode for biasing said transistor to cut off, time delay means comprising a capacitance resistance circuit connected across said source and said emitter electrode and said collector electrode to prevent instantaneous current surges upon application of electric power to said source, means for applying a triggering signal pulse to said base electrode for momentarily rendering said transistor conductive, said transistor alternately passing and blocking current flow through said transformer device depending on its saturation, and means for interrupting the current flow through said transistor to render said switch nonconductive.

References Cited in the file of this patent

UNITED STATES PATENTS

| | | |
|---|---|---|
| 2,676,251 | Scarbrough | Apr. 20, 1954 |
| 2,826,731 | Paynter | Mar. 11, 1958 |
| 2,946,924 | Gerlach et al. | July 26, 1960 |

UNITED STATES PATENT OFFICE

CERTIFICATE OF CORRECTION

Patent No. 3,116,465 December 31, 1963

John Baude

It is hereby certified that error appears in the above numbered patent requiring correction and that the said Letters Patent should read as corrected below.

Column 4, line 5, before "coil" insert -- first --; line 26, for "coil;" read -- coil, --.

Signed and sealed this 2nd day of June 1964.

(SEAL)
Attest:

ERNEST W. SWIDER
Attesting Officer

EDWARD J. BRENNER
Commissioner of Patents